United States Patent
Jeong et al.

(10) Patent No.: US 9,570,624 B2
(45) Date of Patent: Feb. 14, 2017

(54) THIN FILM TRANSISTOR AND METHOD FOR FABRICATING THE SAME

(71) Applicant: Samsung Display Co., Ltd., Yongin, Gyeonggi-do (KR)

(72) Inventors: Woong-Hee Jeong, Yongin (KR); Sun-Kwang Kim, Yongin (KR); Hyeon-Sik Kim, Yongin (KR); Byung-Du Ahn, Yongin (KR); Chaun-Gi Choi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1 day.

(21) Appl. No.: 14/620,907

(22) Filed: Feb. 12, 2015

(65) Prior Publication Data

US 2015/0243793 A1  Aug. 27, 2015

(30) Foreign Application Priority Data

Feb. 26, 2014  (KR) .................. 10-2014-0022292

(51) Int. Cl.
*H01L 29/786* (2006.01)
*H01L 29/66* (2006.01)

(52) U.S. Cl.
CPC ..... *H01L 29/7869* (2013.01); *H01L 29/66969* (2013.01)

(58) Field of Classification Search
None
See application file for complete search history.

(56) References Cited

U.S. PATENT DOCUMENTS

| | | | |
|---|---|---|---|
| 5,962,896 A | * | 10/1999 | Yabuta ............. H01L 29/78669 257/347 |
| 7,279,371 B2 | | 10/2007 | Kim |
| 8,309,961 B2 | | 11/2012 | Yamazaki et al. |
| 8,421,083 B2 | | 4/2013 | Yamazaki et al. |
| 8,426,852 B2 | | 4/2013 | Lee et al. |

(Continued)

FOREIGN PATENT DOCUMENTS

| | | |
|---|---|---|
| JP | 2008-276212 | 11/2008 |
| JP | 2009-231613 | 10/2009 |

(Continued)

*Primary Examiner* — Ali Naraghi
(74) *Attorney, Agent, or Firm* — Knobbe Martens Olson & Bear LLP

(57) ABSTRACT

A thin film transistor includes a gate electrode, a gate insulating layer, an oxide semiconductor layer, an oxide buffer layer, a protective layer, and source and drain electrodes. The gate electrode is formed on a substrate. The gate insulating layer is formed on the substrate. The oxide semiconductor layer is formed on the gate insulating layer and includes a source, a channel and a drain region. The oxide buffer layer is formed on the oxide semiconductor layer, and has a carrier concentration lower than that of the oxide semiconductor layer. The protective layer is formed on the oxide buffer layer and the gate insulating layer, and has contact holes formed therein so that the oxide buffer layer in the source and drain regions are exposed therethrough. The source and drain electrodes are coupled with the oxide buffer layer in the source and drain regions through the contact holes.

20 Claims, 4 Drawing Sheets

(56) References Cited

U.S. PATENT DOCUMENTS

| | | | | |
|---|---|---|---|---|
| 2007/0052025 A1* | 3/2007 | Yabuta | ............... | H01L 29/7869 257/347 |
| 2007/0069209 A1* | 3/2007 | Jeong | ............... | H01L 29/78621 257/57 |
| 2009/0140251 A1 | 6/2009 | Yamazaki | | |
| 2009/0294772 A1* | 12/2009 | Jeong | ................ | H01L 27/1225 257/59 |
| 2012/0223300 A1 | 9/2012 | Kang et al. | | |
| 2012/0327321 A1 | 12/2012 | Huang et al. | | |
| 2013/0048996 A1 | 2/2013 | Noda et al. | | |
| 2014/0291665 A1* | 10/2014 | Kim | .................. | H01L 29/7869 257/43 |
| 2014/0346496 A1* | 11/2014 | Ro | ..................... | H01L 27/1248 257/43 |

FOREIGN PATENT DOCUMENTS

| | | |
|---|---|---|
| KR | 10-2000-0040113 | 7/2000 |
| KR | 10-0806893 | 2/2008 |
| KR | 10-2010-0002504 | 1/2010 |
| KR | 10-2010-0094275 | 8/2010 |
| KR | 10-2012-0129746 | 11/2012 |
| KR | 10-2013-0010103 | 1/2013 |

* cited by examiner

THIN FILM TRANSISTOR AND METHOD FOR FABRICATING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2014-0022292, filed on Feb. 26, 2014, in the Korean Intellectual Property Office, the entire contents of which are incorporated herein by reference in their entirety.

BACKGROUND

Field

Embodiments of the present invention relate to a thin film transistor having an oxide semiconductor layer and a method for fabricating the same.

Description of the Related Technology

In general, a thin film transistor includes a semiconductor layer configured to provide a channel region, a source region and a drain region; and a gate electrode overlapped with the channel region of the semiconductor layer, the gate electrode being insulated from the semiconductor layer by a gate insulating layer.

Recently, an oxide semiconductor has been used as the semiconductor layer of the thin film transistor.

The oxide semiconductor including zinc oxide (ZnO) as a main component has an amorphous form and is evaluated as a stable material. If the oxide semiconductor is used as the semiconductor layer of the thin film transistor, the thin film transistor can be fabricated at a low temperature, using the existing equipment and an ion injection process can be is omitted.

However, the electrical characteristics of the thin film transistor having the oxide semiconductor layer are easily changed depending on its structure and process conditions, and therefore, the reliability of the thin film transistor is low.

SUMMARY OF CERTAIN INVENTIVE ASPECTS

Embodiments provide a thin film transistor and a method for fabricating the same, which can have improved reliability.

According to one aspect, a thin film transistor includes a substrate; a gate electrode formed on the substrate; a gate insulating layer formed on the substrate; an oxide semiconductor layer formed on the gate insulating layer, the oxide semiconductor layer including a source region, a channel region and a drain region; an oxide buffer layer formed on the oxide semiconductor layer, the oxide buffer layer having a carrier concentration lower than that of the oxide semiconductor layer; a protective layer formed on the oxide buffer layer and the gate insulating layer, the protective layer having contact holes formed therein so that the oxide buffer layer in the source and drain regions are exposed therethrough; and source and drain electrodes coupled with the oxide buffer layer in the source and drain regions through the contact holes.

According to another aspect a method for fabricating a thin film transistor includes forming a gate electrode on a substrate; forming a gate insulating layer on the substrate; forming an oxide semiconductor layer on the gate insulating layer, wherein the oxide semiconductor layer includes a source region, a channel region and a drain region; forming an oxide buffer layer on the oxide semiconductor layer, wherein the oxide buffer layer has a carrier concentration lower than that of the oxide semiconductor layer; forming a protective layer on the oxide buffer layer and the gate insulating layer and then forming contact holes through which the oxide buffer layer in the source and drain regions are exposed; and forming source and drain electrodes coupled with the oxide buffer layer in the source and drain region through the contact holes.

The oxide semiconductor layer may include zinc oxide (ZnO). The oxide semiconductor layer may be doped with at least one ion of gallium (Ga), indium (In), stannum (Sn), zirconium (Zr), hafnium (Hf), magnesium (Mg), titanium (Ti) or vanadium (V).

The carrier concentration of the oxide buffer layer may be from about $1e+12\#/cm^3$ to about $1e+15\#/cm^3$. The oxide buffer layer may include at least two materials selected from the group consisting of stannum (Sn), gallium (Ga), hafnium (Hf), magnesium (Mg), zirconium (Zr), aluminum (Al) and lanthanum (La). The at least two materials may be stannum (Sn) and gallium (Ga), and the stannum (Sn) and the gallium (Ga) may be mixed at a ratio of 9:1 to 1:9. At least one material of hafnium (Hf), magnesium (Mg), zirconium (Zr), aluminum (Al) and lanthanum (La) may be further mixed together with the gallium (Ga). The oxide buffer layer may be formed to a thickness of about 10 Å to about 500 Å.

The protective layer may include at least one material selected from the group consisting of silicon oxide ($Si_xO_y$), silicon nitride ($Si_xN_y$) or gallium oxide ($Ga_xO_y$), wherein x and y each range from 1 to 3.

The source and drain electrodes may include copper (Cu). The source and drain electrodes may be formed into a laminated structure of copper (Cu) and oxide. The source and drain electrodes may not be overlapped with the gate electrode.

The thin film transistor may further include an insulating layer formed between the substrate and the gate electrode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals generally refer to like elements throughout.

DETAILED DESCRIPTION OF CERTAIN INVENTIVE EMBODIMENTS

Figure 1:
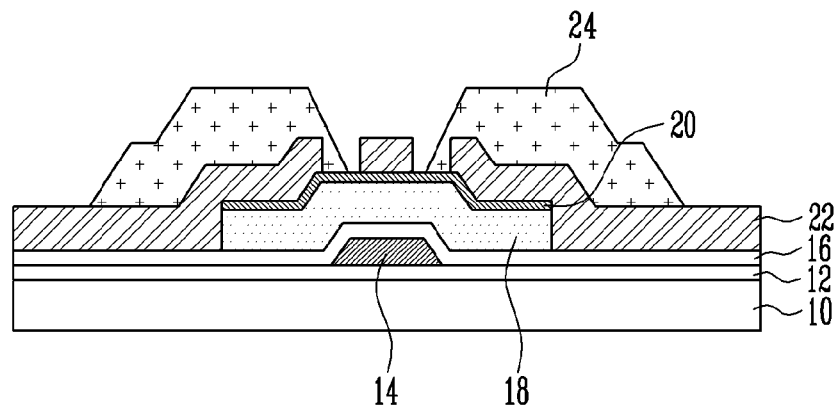
FIG. 1 is a sectional view illustrating a thin film transistor according to an embodiment.

In the following detailed description, certain embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements. In the drawings, the thickness or size of layers may be exaggerated for clarity and not necessarily drawn to scale.

FIG. 1 is a sectional view illustrating a thin film transistor according to an embodiment.

Referring to FIG. 1, a gate electrode 14 is formed on a substrate 10, and a gate insulating layer 16 is formed on the substrate 10 including the gate electrode 14. An insulating layer 12 may be formed as a buffer layer between the substrate 10 and the gate electrode 14.

An oxide semiconductor layer 18 is formed on the gate insulating layer 16 including the gate electrode 14. The oxide semiconductor layer 18 includes a source region, a channel region and a drain region.

A buffer layer 20 is formed on the oxide semiconductor layer 18, using a conductive oxide having a carrier concentration lower than that of the oxide semiconductor layer 18, and a protective layer 22 is formed on the oxide buffer layer 20 and the gate insulating layer 16. Contact holes are formed in the protective layer 22 so that the oxide buffer layer 20 in the source and drain regions is exposed therethrough.

Source and drain electrodes 24 are formed on the protective layer 22 to be coupled with the buffer layer 20 in the source and drain regions through the contact holes. The source and drain electrodes 24 are formed not to be overlapped with the gate electrode 14.

FIGS. 2A to 2E are sectional views illustrating a method for fabricating the thin film transistor according to an embodiment.

Figure 2A:
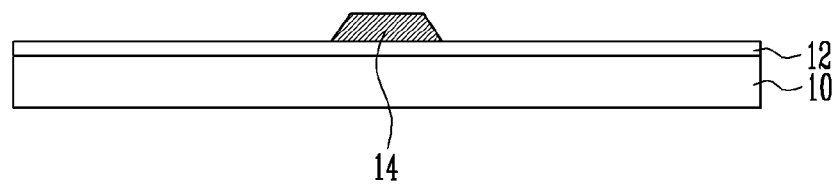
FIGS. 2A to 2E are sectional views illustrating a method for fabricating the thin film transistor according to an embodiment.

Referring to FIG. 2A, a gate electrode 14 is formed on a substrate 10.

An insulating layer 12 is formed as a buffer layer on the substrate 10, using an insulating material such as silicon oxide or silicon nitride, for example, and a gate electrode 14 is formed on the insulating layer 12.

The substrate 10 may include a semiconductor substrate, a metal substrate or an insulating substrate made of transparent glass, resin or the like.

The gate electrode 14 may include a metal or doped poly-silicon. The metal may include aluminum (Al), molybdenum (Mo), chrome (Cr), tantalum (Ta), titanium (Ti), tungsten (W), copper (Cu), silver (Ag), and the like.

Figure 2B:
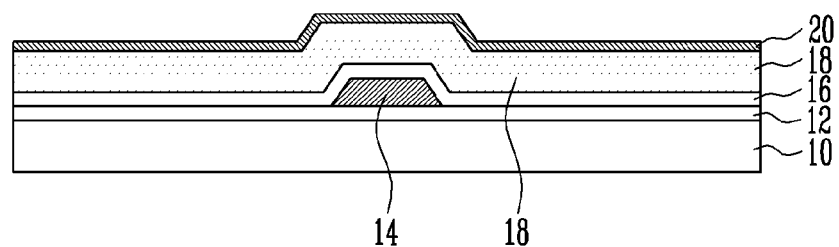

Referring to FIG. 2B, a gate insulating layer 16 is formed on the substrate 10 including the gate electrode 14, and an oxide semiconductor layer 18 and a buffer layer 20 are sequentially formed on the gate insulating layer 16.

The gate insulating layer 16 may include a silicon oxide layer ($SiO_2$), silicon nitride layer (SiN) or a laminated structure thereof.

The oxide semiconductor layer 18 may include zinc oxide (ZnO). The oxide semiconductor layer 18 may be doped with at least one ion of gallium (Ga), indium (In), stannum (Sn), zirconium (Zr), hafnium (Hf), magnesium (Mg), titanium (Ti), vanadium (V), or the like. The oxide semiconductor layer 18 is formed to have, for example, a carrier concentration of about $1e+15\#/cm^3$ to $1e+17\#/cm^3$.

The buffer layer 20 includes a conductive oxide having a carrier concentration lower than that of the oxide semiconductor layer 18. The carrier concentration of the oxide buffer layer 20 is adjusted to about $1e+12\#/cm^3$ to $1e+15\#/cm^3$.

The oxide buffer layer 20 may include at least two materials selected from stannum (Sn), gallium (Ga), hafnium (Hf), magnesium (Mg), zirconium (Zr), aluminum (Al), lanthanum (La), or the like. For example, the stannum (Sn) having durability against an etchant and the gallium (Ga) for adjusting carrier concentration (conductivity) may be mixed at a ratio of about 9:1 to 1:9. At least one material of hafnium (Hf), magnesium (Mg), zirconium (Zr), aluminum (Al) and lanthanum (La), which have high affinity with oxygen, may be further mixed together with the gallium (Ga).

When the oxide buffer layer 20 is formed thick, it is difficult to have conductivity. Hence, the oxide buffer layer 20 is formed to a thickness of about 10 Å to about 500 Å.

The oxide buffer layer 20 has conductivity of a predetermined level for the purpose of electrical connection between the oxide semiconductor layer 18 and the source and drain electrodes 24, but the conductivity of the oxide buffer layer 20 is lower than that of the oxide semiconductor layer 18. Hence, a channel in which carriers (electrons) substantially move may be formed in the oxide semiconductor layer 18.

Figure 2C:
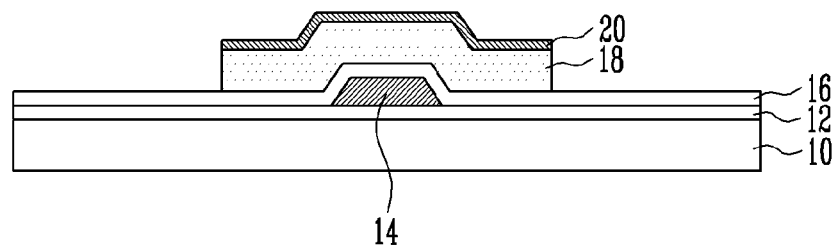

Referring to FIG. 2C, the oxide buffer layer 20 and the oxide semiconductor layer 18 are patterned. A structure in which the oxide semiconductor layer 18, as an active layer of the thin film transistor, including a source region, a channel region and a drain region, and the oxide buffer layer 20 formed thereon are stacked is completed through the patterning process.

Figure 2D:
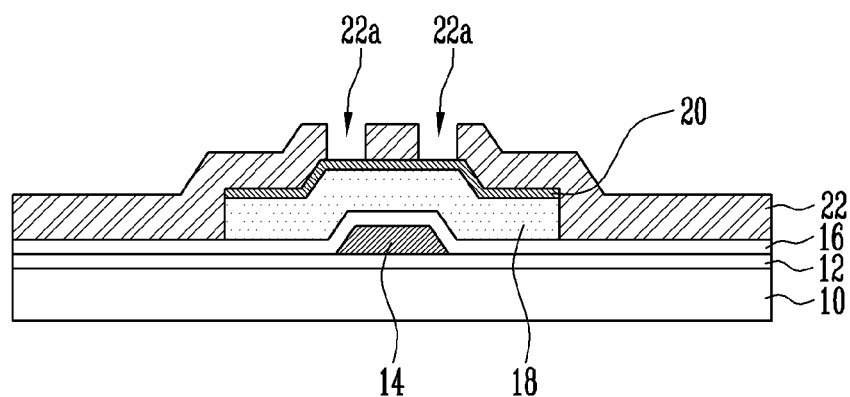

Referring to FIG. 2D, a protective layer 22 is formed on the entire upper surface of the substrate 10 including the oxide buffer layer 20 and the gate insulating layer 16 and then patterned, thereby forming contact holes 22a through which the oxide buffer layer 20 in the source and drain regions is exposed.

The protective layer 22 may include at least one of silicon oxide ($Si_xO_y$), silicon nitride ($Si_xN_y$) and gallium oxide ($Ga_xO_y$). Here, the x and y range from 1 to 3.

The patterning process includes a photolithography process of forming a photoresist pattern on the protective layer 22, and an etching process of removing the protective layer 22 at a portion where the contact holes 22a are to be formed, using the photoresist pattern as a mask. When the contact holes 22a are formed, the oxide semiconductor layer 18 is not directly exposed by the oxide buffer layer 20, and hence it is possible to prevent the oxide semiconductor layer 18 from being etched.

In order to effectively prevent the etching of the oxide semiconductor layer 18, the oxide buffer layer 20 has an etching selection ratio with the protective layer 22 or the oxide semiconductor layer 18. In addition, the oxide buffer layer 20 has conductivity of a predetermined level for the purpose of the electrical connection between the oxide semiconductor layer 18 and the source and drain electrodes 24. The materials (oxides) of the oxide buffer layer 20 can satisfy the aforementioned conditions.

When the oxide buffer layer 20 is omitted, the oxide semiconductor layer 18 is directly exposed through the contact holes 22a. Hence, the oxide semiconductor layer 18 is damaged by etchant, plasma, or the like. If a defect occurs in the oxide semiconductor layer 18 due to the damage, electrons or holes are trapped, and therefore, the carrier concentration of the oxide semiconductor layer 18 may be increased or the threshold voltage of the oxide semiconductor layer 18 may be changed.

Figure 2E:
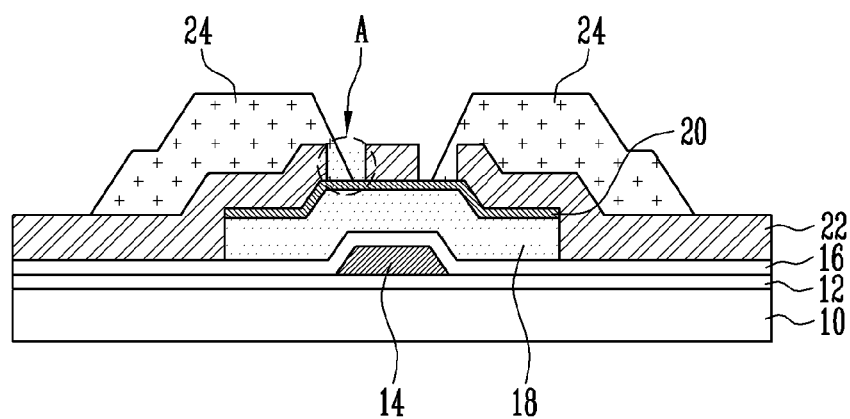

Referring to FIG. 2E, a conductive layer is formed on the protective layer 22 including the contact holes 22a and then patterned, thereby forming the source and drain electrodes 24 coupled with the oxide buffer layer 20 in the source and drain regions through the contact holes 22a.

The conductive layer may include a metal such as molybdenum (Mo), chrome (Cr), tantalum (Ta), titanium (Ti), tungsten (W), copper (Cu) or silver (Ag), or an alloy or laminated structure thereof. For example, the conductive layer may include copper (Cu) or a laminated structure of copper (Cu) and an oxide. An oxide such as GaZnO acts as a clad layer to protect the copper Cu. Alternatively, the conductive layer may be formed into a laminated structure of Mo/Al/Mo.

The source and drain electrodes 24 are patterned not to be overlapped with the gate electrode 14.

When the source and drain electrodes 24 are overlapped with the gate electrode 14, a signal delay or crosstalk may be generated by parasitic capacitance at the overlapped portion. However, the source and drain electrodes 24 are formed not to be overlapped with the gate electrode 14, so that it is possible to minimize the parasitic capacitance between the source and drain electrodes 24 and the gate electrode 14, thereby improving signal transmission and electrical characteristics of the thin film transistor.

When the source and drain electrodes 24 are formed not to be overlapped with the gate electrode 14, a portion (portion A) of the oxide buffer layer 20 may be exposed through the contact holes 22a. In this case, the exposure of the oxide semiconductor layer 18, however, is prevented, and hence it is possible to prevent the oxide semiconductor layer 18 from being etched.

Referring to portion A of FIG. 2E, the source and drain electrodes 24 are patterned so that sidewalls of the source and drain electrodes 24 are inclined. Therefore, portions of the source and drain electrode 24 may be overlapped with the gate electrode 14. However, the parasitic capacitance at the overlapped portions is very small, and hence the signal transmission or electrical characteristic of the thin film transistor is not influenced by the parasitic capacitance.

When the source and drain electrodes 24 include copper (Cu), the interface bonding of the source and drain electrodes 24 with the oxide semiconductor layer 18 becomes inferior due to diffusion of copper atoms, and the contact resistance between the source and drain electrodes 24 and the oxide semiconductor layer 18 may be increased by the inferior interface bonding. In addition, p-type copper atoms are diffused into the n-type oxide semiconductor layer 18, and therefore, the electrical characteristic of the oxide semiconductor layer 18 may be deteriorated.

The oxide buffer layer 20 effectively blocks the diffusion of copper atoms and has conductivity of a predetermined level. Thus, it is possible to ensure stable interface bonding and ohmic contact between the source and drain electrodes 24 and the oxide semiconductor layer 18.

The thin film transistor may be applied to a flat panel display.

Figure 3A:
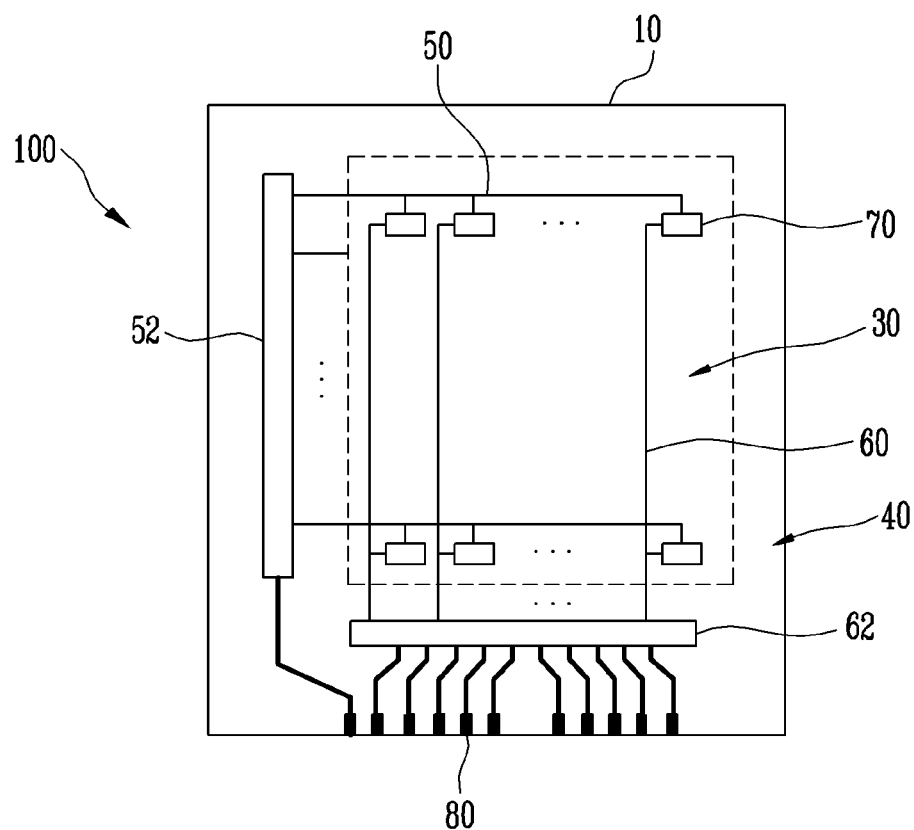
FIGS. 3A and 3B are plan and sectional views respectively illustrating an embodiment of a flat panel display to which the thin film transistor of FIG. 1 is applied.
Figure 3B:
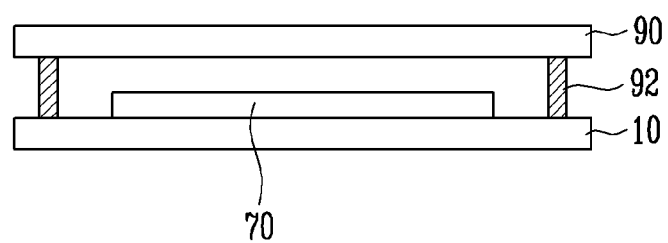

FIGS. 3A and 3B are plan and sectional views respectively illustrating an embodiment of a flat panel display to which the thin film transistor of FIG. 1 is applied. A display panel 100 for displaying images will be mainly described in brief.

The display panel 100 includes a substrate 10 which is a first substrate having several elements formed thereon, an encapsulation substrate 90 which is a second substrate disposed opposite to the substrate 10, a sealing material 92 interposed between the substrate 10 and the encapsulation substrate 90 to surround the elements.

Referring to FIG. 3A, the substrate 10 is defined by a pixel area 30 and a non-pixel area 40 at the periphery of the pixel area 30. A plurality of organic light emitting diodes 70 connected in a matrix form between scan lines 50 and data lines 60 are formed on the substrate 10 of the pixel area 30. Scan and data lines 50 and 60 respectively extended from the scan and data lines 50 and 60 of the pixel area 30, a power supply line (not shown) for operating the organic light emitting diodes 70, and scan and data drivers 52 and 62 for processing signals provided from an outside through pads 80 and supplying the processed signals to the scan and data lines 50 and 60 are formed on the substrate 10 of the non-pixel area 40.

Figure 4:
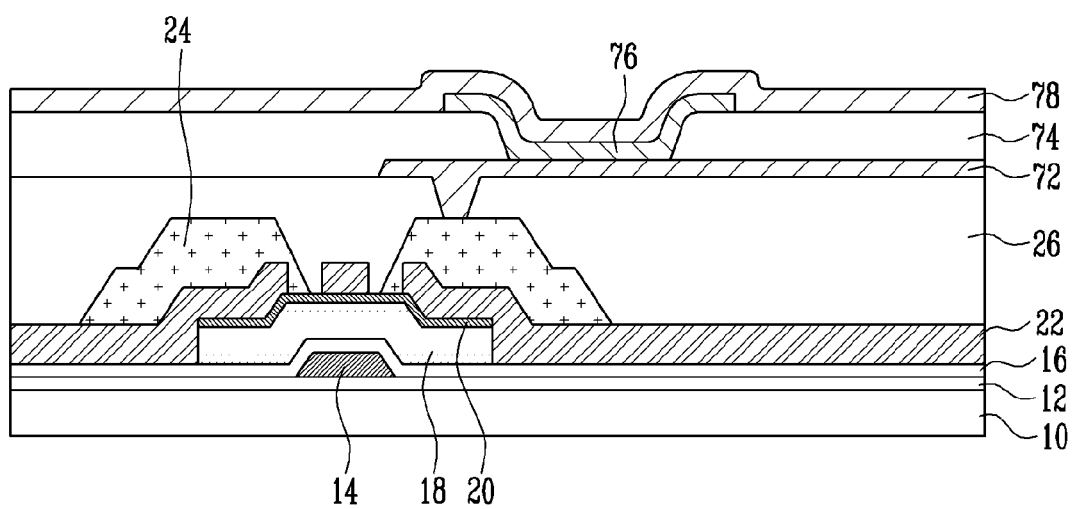
FIG. 4 is a sectional view illustrating an embodiment of an organic light emitting diode.

Referring to FIG. 4, the organic light emitting diode 70 includes an anode electrode 72, a cathode electrode 78, and an organic thin film layer 76 interposed between the anode electrode 72 and the cathode electrode 78. The organic thin film layer 76 is formed into a structure in which a hole transport layer, an organic emission layer and an electrode transport layer are sequentially laminated. A hole injection layer and an electron injection layer may be further included in the structure. The organic light emitting diode 70 may further include a thin film transistor coupled between the scan and data lines 50 and 60 to control an operation of the organic light emitting diode 70, and a capacitor configured to maintain a signal. The thin film transistor is formed into the structure of FIG. 1.

The organic light emitting diode 70 including the thin film transistor configured as described above will be described in detail with reference to FIGS. 3A and 4.

An insulating layer 12 is formed as a buffer layer on the substrate 10 of the pixel area 30, and a gate electrode 14 is formed on the insulating layer 12. In this case, the scan line 50 connected to the gate electrode 14 is formed in the pixel area 30, and the scan line 50 extended from the scan line 50 of the pixel area 30 and the pad 80 for receiving signals provided from the outside may be formed in the non-pixel area 40.

A gate insulating layer 16 is formed on the substrate 10 including the gate electrode 14, and a laminated structure of an oxide semiconductor layer 18 and an oxide buffer layer 20 is formed on the gate insulating layer 16 including the gate electrode 14.

A protective layer 22 is formed on the oxide buffer layer 20 and the gate insulating layer 16, and source and drain electrodes 24 coupled with the oxide buffer layer 20 in source and drain regions through contact holes are formed on the protective layer 22. In this case, the data line 60 connected to the source and drain electrodes 24 is formed in the pixel area 30, and the data line 60 extended from the data line 60 of the pixel area and the pad 80 for receiving signals provided from the outside may be formed in the non-pixel area 40.

Subsequently, a planarization layer 26 for planarizing a surface of the substrate 10 including the thin film transistor is formed on the entire surface of the substrate 10 in the pixel area 30. Via holes are formed in the planarization layer 26 so that predetermined portions of the source and drain electrodes 24 are exposed, and the anode electrode 72 coupled with the source or drain electrode 24 through the via holes are formed on the planarization layer 26.

A pixel defining layer 74 is formed on the planarization layer 26 so that a partial area (emission region) of the anode electrode 72 is exposed. The organic thin film layer 76 is formed on the exposed anode electrode 72, and the cathode electrode 78 is formed on the pixel defining layer 74 including the organic thin film layer 76.

Referring to 3B, the encapsulation substrate 90 for sealing the pixel area 30 is disposed above the substrate 10 having the organic light emitting diode 70 formed thereon, and the encapsulation substrate 90 and the substrate 10 are bonded together by the sealing material 92, thereby completing the display panel 100.

In the flat panel display according to this embodiment, current and voltage characteristics are improved by the thin film transistor enhanced as compared with the existing thin film transistors, thereby improving the image quality of the flat panel display. Particularly, the luminance of the flat panel display using a current driving method is not degraded by the thin film transistor of which threshold voltage is stably maintained, thereby obtaining high reliability.

In the thin film transistor of a bottom gate structure, the oxide buffer layer is formed on the oxide semiconductor layer, using a conductive oxide having a carrier concentration lower than that of the oxide semiconductor layer. The oxide buffer layer prevents damage of the oxide semiconductor layer in the etching process of forming the source and drain electrodes, and ensures ohmic contact between the source and drain electrodes and the oxide semiconductor layer. In addition, the oxide buffer layer blocks metal ions diffused from the source and drain electrodes, thereby maintaining stable interface bonding.

Further, the structure in which the source and drain electrodes and the gate electrode are not overlapped with each other is realized, so that it is possible to prevent a signal delay or crosstalk caused by parasitic capacitance. In the structure in which the source and drain electrodes and the gate electrode are not overlapped with each other, the effect generated by the oxide buffer layer is particularly valid, and thus it is possible to implement the thin film transistor having electrical characteristics and reliability, improved as compared with the existing thin film transistors.

Example embodiments have been disclosed herein, and although specific terms are employed, they are used and are to be interpreted in a generic and descriptive sense only and not for purposes of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor, comprising:
   a substrate;
   a gate electrode formed on the substrate;
   a gate insulating layer formed on the substrate;
   an oxide semiconductor layer formed on the gate insulating layer, the oxide semiconductor layer including a source region, a channel region and a drain region;
   an oxide buffer layer formed on the oxide semiconductor layer including the source region, the channel region and the drain region, the oxide buffer layer having a carrier concentration lower than that of the oxide semiconductor layer, and the oxide buffer layer completely covering the channel region;
   a protective layer formed on the oxide buffer layer and the gate insulating layer, the protective layer having contact holes formed therein so that the oxide buffer layer in the source and drain regions are exposed therethrough; and
   source and drain electrodes coupled with the oxide buffer layer in the source and drain regions through the contact holes.

2. The thin film transistor of claim 1, wherein the oxide semiconductor layer includes zinc oxide (ZnO).

3. The thin film transistor of claim 2, wherein the oxide semiconductor layer is doped with at least one ion of gallium (Ga), indium (In), stannum (Sn), zirconium (Zr), hafnium (Hf), magnesium (Mg), titanium (Ti) or vanadium (V).

4. The thin film transistor of claim 1, wherein the carrier concentration of the oxide buffer layer is from about $1e+12\#/cm^3$ to about $1e+15\#/cm^3$.

5. The thin film transistor of claim 1, wherein the oxide buffer layer includes at least two materials selected from the group consisting of stannum (Sn), gallium (Ga), hafnium (Hf), magnesium (Mg), zirconium (Zr), aluminum (Al) and lanthanum (La).

6. The thin film transistor of claim 5, wherein the at least two materials are stannum (Sn) and gallium (Ga), and the stannum (Sn) and the gallium (Ga) are mixed at a ratio of 9:1 to 1:9.

7. The thin film transistor of claim 6, wherein at least one material of hafnium (Hf), magnesium (Mg), zirconium (Zr), aluminum (Al) and lanthanum (La) is further mixed together with the gallium (Ga).

8. The thin film transistor of claim 1, wherein the oxide buffer layer is formed to a thickness of about 10 Å to about 500 Å.

9. The thin film transistor of claim 1, wherein the protective layer includes at least one material selected from the group consisting of silicon oxide ($Si_xO_y$), silicon nitride ($Si_xN_y$) or gallium oxide ($Ga_xO_y$), wherein x and y each range from 1 to 3.

10. The thin film transistor of claim 1, wherein the source and drain electrodes include copper (Cu).

11. The thin film transistor of claim 10, wherein the source and drain electrodes are formed into a laminated structure of copper (Cu) and oxide.

12. The thin film transistor of claim 1, wherein the source and drain electrodes are not overlapped with the gate electrode.

13. The thin film transistor of claim 1, further comprising an insulating layer formed between the substrate and the gate electrode.

14. A method for fabricating a thin film transistor, the method comprising:
   forming a gate electrode on a substrate;
   forming a gate insulating layer on the substrate;

forming an oxide semiconductor layer on the gate insulating layer, wherein the oxide semiconductor layer includes a source region, a channel region and a drain region;

forming an oxide buffer layer on the oxide semiconductor layer including the source region, the channel region and the drain region, wherein the oxide buffer layer has a carrier concentration lower than that of the oxide semiconductor layer, and wherein the oxide buffer layer completely covers the channel region;

forming a protective layer on the oxide buffer layer and the gate insulating layer and then forming contact holes through which the oxide buffer layer in the source and drain regions are exposed; and forming source and drain electrodes coupled with the oxide buffer layer in the source and drain regions through the contact holes.

15. The method of claim 14, wherein the oxide semiconductor layer is formed of zinc oxide (ZnO).

16. The method of claim 15, wherein the oxide semiconductor layer is doped with at least one ion of gallium (Ga), indium (In), stannum (Sn), zirconium (Zr), hafnium (Hf), magnesium (Mg), titanium (Ti) or vanadium (V).

17. The method of claim 14, wherein the carrier concentration of the oxide buffer layer is from about $1e+12\#/cm^3$ to about $1e+15\#/cm^3$.

18. The method of claim 14, wherein the oxide buffer layer includes at least two materials selected from the group consisting of stannum (Sn), gallium (Ga), hafnium (Hf), magnesium (Mg), zirconium (Zr), aluminum (Al) and lanthanum (La).

19. The method of claim 18, wherein the at least two materials are stannum (Sn) and gallium (Ga), and the stannum (Sn) and the gallium (Ga) are mixed at a ratio of 9:1 to 1:9.

20. The method of claim 14, wherein the source and drain electrodes are formed not to be overlapped with the gate electrode.

* * * * *